(12) United States Patent
Smirnov et al.

(10) Patent No.: US 11,371,134 B2
(45) Date of Patent: Jun. 28, 2022

(54) NANOWIRE GRID POLARIZER ON A CURVED SURFACE AND METHODS OF MAKING AND USING

(71) Applicant: Wostec, Inc., San Francisco, CA (US)

(72) Inventors: Valery Konstantinovich Smirnov, Yaroslavl (RU); Dmitry Stanislavovich Kibalov, Yaroslavl (RU)

(73) Assignee: Wostec, Inc., San Francisco, CA (US)

( * ) Notice: Subject to any disclaimer, the term of this patent is extended or adjusted under 35 U.S.C. 154(b) by 198 days.

(21) Appl. No.: 16/488,553

(22) PCT Filed: May 23, 2017

(86) PCT No.: PCT/RU2017/000338
§ 371 (c)(1),
(2) Date: Aug. 23, 2019

(87) PCT Pub. No.: WO2018/156047
PCT Pub. Date: Aug. 30, 2018

(65) Prior Publication Data
US 2019/0390328 A1    Dec. 26, 2019

Related U.S. Application Data

(63) Continuation-in-part of application No. PCT/RU2017/000095, filed on Feb. 27, 2017.

(51) Int. Cl.
*C23C 14/58* (2006.01)
*B82Y 40/00* (2011.01)
(Continued)

(52) U.S. Cl.
CPC ........ *C23C 14/5833* (2013.01); *C23C 14/165* (2013.01); *C23C 14/35* (2013.01);
(Continued)

(58) Field of Classification Search
CPC ........................ C23C 14/5833; C23C 14/5873
See application file for complete search history.

(56) References Cited

U.S. PATENT DOCUMENTS

| 4,009,933 A | 3/1977 | Firester |
| 4,072,541 A | 2/1978 | Meulenberg et al. |

(Continued)

FOREIGN PATENT DOCUMENTS

| CN | 101486442 | 7/2009 |
| JP | 2010085990 | 4/2010 |

(Continued)

OTHER PUBLICATIONS

International Search Report and Written Opinion for International Patent Application No. PCT/RU2011/000489 dated Mar. 1, 2012.
(Continued)

*Primary Examiner* — John J Brayton
(74) *Attorney, Agent, or Firm* — Branch Partners PLLC; Bruce E. Black

(57) ABSTRACT

An array of nanowires with a period smaller than 150 nm on the surface of curved transparent substrate can be used for applications such as optical polarizers. A curved hard nanomask can be used to manufacture such structures. This nanomask includes a substantially periodic array of substantially parallel elongated elements having a wavelike cross-section. The fabrication method of the nanomask uses ion beams.

27 Claims, 10 Drawing Sheets

(51) Int. Cl.
| | |
|---|---|
| *C23C 14/35* | (2006.01) |
| *C23C 14/16* | (2006.01) |
| *B82Y 20/00* | (2011.01) |
| *G02B 5/30* | (2006.01) |

(52) U.S. Cl.
CPC .......... *C23C 14/5873* (2013.01); *B82Y 20/00* (2013.01); *B82Y 40/00* (2013.01); *G02B 5/3058* (2013.01)

(56) References Cited

U.S. PATENT DOCUMENTS

| | | | |
|---|---|---|---|
| 4,233,109 A | 11/1980 | Nishizawa | |
| 4,400,409 A | 8/1983 | Izu et al. | |
| 4,460,434 A | 7/1984 | Johnson et al. | |
| 4,556,524 A | 12/1985 | Cullis et al. | |
| 4,857,080 A | 8/1989 | Baker et al. | |
| 5,160,618 A | 11/1992 | Burggraaf et al. | |
| 5,165,954 A * | 11/1992 | Parker .................. | C23C 14/048 250/492.21 |
| 5,412,500 A | 5/1995 | Fergason | |
| 5,473,138 A | 12/1995 | Singh et al. | |
| 5,498,278 A | 3/1996 | Edlund | |
| 5,530,272 A | 6/1996 | Kudo et al. | |
| 5,578,379 A | 11/1996 | Stutzmann et al. | |
| 5,652,020 A | 7/1997 | Collins et al. | |
| 5,663,592 A | 9/1997 | Miyazawa et al. | |
| 5,702,503 A | 12/1997 | Tse Tang | |
| 5,734,092 A | 3/1998 | Wang et al. | |
| 5,747,180 A | 5/1998 | Miller et al. | |
| 5,753,014 A | 5/1998 | Van Rijn | |
| 6,258,617 B1 | 7/2001 | Nitta et al. | |
| 6,274,007 B1 | 8/2001 | Smirnov et al. | |
| 6,417,939 B1 | 7/2002 | Laude | |
| 6,452,724 B1 | 9/2002 | Hansen et al. | |
| 6,518,194 B2 | 2/2003 | Winningham et al. | |
| 6,580,172 B2 | 6/2003 | Mancini et al. | |
| 6,667,240 B2 | 12/2003 | Ozaki et al. | |
| 6,706,576 B1 | 3/2004 | Ngo et al. | |
| 6,810,899 B2 | 11/2004 | Franz et al. | |
| 6,954,275 B2 | 10/2005 | Choi et al. | |
| 7,001,446 B2 | 2/2006 | Roark et al. | |
| 7,175,694 B2 | 2/2007 | Ma et al. | |
| 7,265,374 B2 | 9/2007 | Lee et al. | |
| 7,338,275 B2 | 3/2008 | Choi et al. | |
| 7,384,792 B1 | 6/2008 | Wang et al. | |
| 7,453,565 B2 | 11/2008 | Wang et al. | |
| 7,604,690 B2 | 10/2009 | Smirnov et al. | |
| 7,768,018 B2 * | 8/2010 | Smirnov .............. | G02B 5/3058 257/80 |
| 7,772,079 B2 | 8/2010 | Meng et al. | |
| 7,791,190 B2 | 9/2010 | Flores et al. | |
| 7,977,252 B2 | 7/2011 | Smirnov et al. | |
| 8,033,706 B1 | 10/2011 | Kelly et al. | |
| 8,426,320 B2 | 4/2013 | Smirnov et al. | |
| 8,859,440 B2 | 10/2014 | Smirnov et al. | |
| 8,859,888 B2 | 10/2014 | Smirnov et al. | |
| 2002/0074307 A1 | 6/2002 | Cotteverte et al. | |
| 2002/0142704 A1 | 10/2002 | Hu et al. | |
| 2002/0154403 A1 | 10/2002 | Trotter | |
| 2002/0170497 A1 | 11/2002 | Smirnov et al. | |
| 2003/0111106 A1 | 6/2003 | Nagano et al. | |
| 2003/0152787 A1 | 8/2003 | Arakawa et al. | |
| 2003/0171076 A1 | 9/2003 | Moloney et al. | |
| 2003/0183270 A1 | 10/2003 | Falk et al. | |
| 2003/0218744 A1 | 11/2003 | Shalaev et al. | |
| 2004/0070829 A1 | 4/2004 | Kurz et al. | |
| 2004/0129135 A1 | 7/2004 | Roark et al. | |
| 2004/0135160 A1* | 7/2004 | Cok .................. | C23C 14/042 257/88 |
| 2004/0174596 A1 | 9/2004 | Umeki | |
| 2004/0190116 A1 | 9/2004 | Lezec et al. | |
| 2004/0201890 A1 | 10/2004 | Crosby | |
| 2004/0238851 A1 | 12/2004 | Flores et al. | |
| 2005/0046943 A1 | 3/2005 | Suganuma | |
| 2005/0130072 A1 | 6/2005 | Koeda | |
| 2006/0043400 A1 | 3/2006 | Erchak et al. | |
| 2006/0159958 A1 | 7/2006 | Lee | |
| 2006/0205875 A1 | 9/2006 | Cha et al. | |
| 2006/0210886 A1 | 9/2006 | Mizuyama et al. | |
| 2006/0230937 A1 | 10/2006 | Smirnov et al. | |
| 2006/0273067 A1 | 12/2006 | Smirnov et al. | |
| 2006/0279843 A1 | 12/2006 | Kurt et al. | |
| 2007/0012355 A1 | 1/2007 | LoCascio et al. | |
| 2007/0082457 A1 | 4/2007 | Chou et al. | |
| 2007/0217008 A1 | 9/2007 | Wang et al. | |
| 2008/0072958 A1 | 3/2008 | Dutta | |
| 2008/0119034 A1 | 5/2008 | Smirnov et al. | |
| 2008/0128727 A1 | 6/2008 | Erchak et al. | |
| 2008/0135864 A1 | 6/2008 | David et al. | |
| 2008/0169479 A1 | 7/2008 | Xu et al. | |
| 2009/0118605 A1 | 5/2009 | Van Duyne et al. | |
| 2009/0162966 A1 | 6/2009 | Jawarani et al. | |
| 2009/0214885 A1 | 8/2009 | Her et al. | |
| 2010/0110551 A1 | 5/2010 | Lamansky et al. | |
| 2010/0171949 A1 | 7/2010 | Mazur et al. | |
| 2010/0195204 A1 | 8/2010 | Walker | |
| 2010/0276612 A1 | 11/2010 | Norwood et al. | |
| 2010/0300893 A1 | 12/2010 | Suh et al. | |
| 2011/0197959 A1 | 8/2011 | Catchpole et al. | |
| 2011/0232744 A1 | 9/2011 | Larsen et al. | |
| 2011/0248386 A1 | 10/2011 | Smirnov et al. | |
| 2012/0176766 A1 | 7/2012 | Natsumeda | |
| 2012/0195335 A1 | 8/2012 | Kalosha et al. | |
| 2012/0314189 A1 | 12/2012 | Natsumeda et al. | |
| 2013/0008497 A1 | 1/2013 | Smirnov et al. | |
| 2013/0057938 A1 | 3/2013 | Natsumeda et al. | |
| 2013/0228780 A1 | 9/2013 | Smirnov et al. | |
| 2014/0030531 A1 | 1/2014 | Mori | |
| 2014/0151715 A1 | 6/2014 | Smirnov et al. | |
| 2014/0352779 A1 | 12/2014 | Smirnov et al. | |
| 2015/0042988 A1 | 2/2015 | Smirnov et al. | |
| 2016/0018579 A1 | 1/2016 | Smirnov et al. | |
| 2016/0336036 A1 | 11/2016 | Bhaskaran et al. | |
| 2017/0068104 A1 | 3/2017 | Ouderkirk et al. | |

FOREIGN PATENT DOCUMENTS

| | | |
|---|---|---|
| RU | 2141699 C1 | 11/1999 |
| RU | 2152108 C1 | 6/2000 |
| RU | 2173003 C2 | 8/2001 |
| RU | 2180885 C1 | 3/2002 |
| RU | 2204179 C1 | 5/2003 |
| RU | 2231171 C1 | 6/2004 |
| RU | 2240280 C1 | 11/2004 |
| RU | 2321101 C1 | 3/2008 |
| TW | 200939471 A | 9/2009 |
| WO | 2000017094 | 3/2000 |
| WO | 2003032398 | 4/2003 |
| WO | 2005050697 A2 | 6/2005 |
| WO | 2010072862 | 7/2010 |
| WO | 2011044687 | 4/2011 |
| WO | 2012009467 | 1/2012 |

OTHER PUBLICATIONS

International Search Report and Written Opinion for International Patent Application No. PCT/RU2011/000631 dated Mar. 1, 2012.
International Search Report and Written Opinion for International Patent Application No. PCT/RU2011/00594 dated Apr. 19, 2012.
International Search Report and Written Opinion for International Patent Application No. PCT/US2006/011420 dated Jun. 26, 2008.
International Search Report and Written Opinion for International Patent Application No. PCT/US2006/021564 dated Jul. 28, 2008.
Karen, A. et al., "Quantitative Investigation of the O2+-Induved Topography of GaAs and other III-V Semiconductors: an STM Study of the Ripple Formation and Suppression of the Secondary Ion Yield Change by Sample Rotation," Surface and Interface Analysis, vol. 23, 1995, pp. 506-513.
Scott, K.L. et al., "Pattern Generators and Microcolumns for Ion Beam Lithography," Journal of Vacuum Science Technology B, 18(6) 2000, pp. 3172-3176.

(56) References Cited

OTHER PUBLICATIONS

Vajo, J.J. et al., "Influence of O2+ Energy, Flux, and Fluence on the Formation and Growth of Sputtering-Induced Ripple Topography on Silicon," Journal of Vacuum Science and Tecnology A. 14(5), 1996, pp. 2709-2720.
Official Communication for U.S. Appl. No. 11/421,384 dated Aug. 21, 2008.
Official Communication for U.S. Appl. No. 11/421,384 dated Apr. 24, 2009.
Official Communication for U.S. Appl. No. 11/421,384 dated Sep. 3, 2009.
Official Communication for U.S. Appl. No. 13/164,387 dated Sep. 6, 2012.
Official Communication for U.S. Appl. No. 13/407,615 dated Mar. 28, 2014.
European Search Report for European Application No. 06851545.1 dated Feb. 8, 2010.
Official Communication for U.S. Appl. No. 13/859,442 dated Oct. 18, 2013.
Official Communication for U.S. Appl. No. 13/859,442 dated May 2, 2014.
Official Communication for U.S. Appl. No. 13/859,442 dated Mar. 27, 2014.
Official Communication for U.S. Appl. No. 11/100,175 dated Oct. 24, 2007.
Official Communication for U.S. Appl. No. 11/100,175 dated May 16, 2008.
Official Communication for U.S. Appl. No. 11/100,175 dated Feb. 9, 2009.
Chapter 7 in the book Sputtering by Particle Bombardment II: Sputtering of Alloys and Compounds, Electron and Neuron Sputtering, Surface Topography, Edited by R. Behrisch, 1983, Springer-Verlag, Berlin-Heidelberg-New York-Tokyo.
Mishra et al. Effect of initial target surface roughness on the evolution of ripple topography induced by oxygen sputtering of Al films, Journal of Applied Physics, vol. 105, 2009, 7 pages.
International Search Report and Written Opinion for PCT/RU2011/000977 dated Sep. 6, 2012.
International Search Report and Written Opinion for PCT/RU2014/000458 dated Feb. 5, 2015.
International Search Report and Written Opinion for PCT/RU2012/000016 dated Sep. 13, 2012.
International Search Report and Written Opinion for PCT/RU2012/000210 dated Dec. 20, 2012.
International Search Report and Written Opinion for PCT/RU2013/000192 dated Dec. 5, 2013.
Supplementary European Search Report for EP Application No. 11870692.8 dated Feb. 11, 2015.
Keller et al., "Optical and structural properties of GaN nanopillar and nanostripe arrays with embedded InGaN/GaN multiquantum wells", Journal of Applied Physics, 100 (2006): pp. 054314-1 to 054314-7.
Official Communication for U.S. Appl. No. 14/172,505 dated Mar. 30, 2015.
Official Communication for U.S. Appl. No. 14/172,505 dated Jun. 30, 2015.
Official Communication for U.S. Appl. No. 14/775,658 dated Feb. 19, 2016.
International Search Report and Written Opinion for PCT Application No. PCT/RU2016/000796 dated Sep. 7, 2017.
International Search Report and Written Opinion for PCT Application No. PCT/RU2017/000338 dated Nov. 16, 2017.
International Search Report and Written Opinion for PCT Application No. PCT/RU2017/000095 dated Nov. 16, 2017.
International Search Report and Written Opinion for PCT Application No. PCT/RU2017/000714 dated Aug. 2, 2018.
Official Communication for U.S. Appl. No. 15/320,241 dated Jan. 22, 2019.
Official Communication for U.S. Appl. No. 15/320,241 dated Jul. 30, 2019.

* cited by examiner

NANOWIRE GRID POLARIZER ON A CURVED SURFACE AND METHODS OF MAKING AND USING

FIELD

The invention relates to non-lithographic methods for manufacturing devices, such as polarizers, that have a grid of metal conductors located on the surface of a curved substrate. The invention also relates to methods and devices for forming periodic wire grids with a period of, for example, 150 nm or less.

BACKGROUND

Wire grid polarizers are widely used in, for example, devices for graphic information imaging (e.g., see U.S. Pat. No. 6,452,724, incorporated herein by reference). The commonly-used technology for manufacturing these devices is based on optical or interference lithography. However, the cost associated with the use of the tools designed for these applications is considered very significant. The existing approach and tools make it difficult to fabricate wire grid polarizers on curved substrates such as spherical or other more complex optical shapes. In addition, the existing approach makes it is very difficult to create wire grid structures with a period of 150 nm or less. While different applications have different requirements, structures with smaller feature size are usually associated with higher performance.

A method for nanorelief formation on a film surface, utilizing plasma modification of a wave-ordered structure (WOS) formed on amorphous silicon layer, was disclosed in Russian Patent Application RU 2204179, incorporated herein by reference.

An example of this approach is schematically illustrated on FIGS. 1A, 1B and 1C. First, a layer of amorphous silicon 2 is deposited on top of the target thin film layer 4. Then, the silicon layer is sputtered with a flow of nitrogen ions 31 to create a wave ordered nanostructure 1. The resultant wave-ordered nanostructure has relatively thick regions of amorphous silicon nitride 10 and relatively thin regions of amorphous silicon nitride 20 situated respectively on the front and back sides of the waves in the wave-ordered structure 1. The waves (elements) of the wave-ordered structure are oriented substantially in one direction along one axis. As shown, the wave troughs are spaced from the surface of the film layer 4 by a distance D that is usually less than the nanostructure period 3. After the wave-ordered nanostructure 1 is formed, its planar pattern, which is shown in FIG. 1A, is transferred into the underlying film layer 4 by selectively etching the amorphous silicon layer 2 while using regions 10 and 20 as a nanomask. The intermediate etched structure, which is shown in FIG. 1C as an array of nanostructures 11, is composed from amorphous silicon nanostripes 2 covered by the regions of amorphous silicon nitride 10. The layer 4 may be etched in exposed areas 12 between silicon nanostripes 2.

Ion beam techniques have been used to shape and polish curved optical surfaces through precise material removal by ion sputtering process, as disclosed in Michael Zeuner, Sven Kiontke, Ion Beam Figuring Technology in Optics Manufacturing: An established alternative for commercial applications, Optik & Photonik, Vol. 7, No. 2, 2012, pp. 56-58; and Vladimir Chutko, Ion Sources, Processes, Design Issues: Ion beam figuring, Control Parameters, Vacuum Technology & Coating Magazine, September 2013, pp. 2-10, both of which are incorporated herein by reference. However, these ion beam tools cannot be used directly to form wave-ordered structures on curved surfaces such as, for example, spherical surfaces, with orientation of waves along the latitude lines (parallel lines) on the globe, for fabricating a linear polarizer.

BRIEF SUMMARY

A variety of optoelectronic and other applications can benefit from efficient methods for forming arrays of nanowires with a period of 150 nm or less on curved surfaces.

To manufacture such structures, a curved hard nanomask is formed by irradiating a curved layer of a first material with an ion flow. The curved hard nanomask may be used in transferring a substantially periodic pattern onto a curved substrate. This nanomask includes a substantially periodic array of substantially parallel elongated elements having a wavelike cross-section and oriented along the lines of intersections of the curved substrate surface with a set of parallel planes. At least some of the elements have the following cross-section: an inner region of first material, a first outer region of a second material covering a first portion of the inner region, and a second outer region of the second material covering a second portion of the inner region and connecting with the first outer region at a wave crest. The first outer region is substantially thicker than the second outer region. The second material is formed by modifying the first material using an ion flow. The substantially parallel, elongated elements having the wavelike cross-section are positioned on the curved layer of the first material along the lines of intersections of the curved layer surface with a set of parallel planes.

In at least some embodiments, the average period of the substantially periodic array is in a range from 20 to 150 nm.

In at least some other embodiments, the curved substrate is a lens having a diameter in a range of 4-200 mm.

Another embodiment is a method of forming a curved hard nanomask for transferring a substantially periodic pattern onto a curved substrate. The method includes depositing a first material to form a curved surface layer on top of a surface of a curved substrate; and irradiating the surface of the curved surface layer with a flow of ions until a curved hard nanomask is formed, the nanomask including a substantially periodic array of substantially parallel elongated elements having a wavelike cross-section and oriented along the lines of intersections of the layer surface with a set of parallel planes, at least some of the elements having the following structure in cross-section: an inner region of first material, a first outer region of a second material covering a first portion of the inner region, and a second outer region of the second material covering a second portion of the inner region and connecting with the first outer region at a wave crest, where the first outer region is substantially thicker than the second outer region, and where the second material is formed by modifying the first material by the ion flow, where the ion flow is arranged so as a local plane of ion incidence is substantially perpendicular to the set of parallel planes and oriented along a local surface normal of the surface layer.

In at least some embodiments, the curved substrate is a lens, during the formation of curved hard nanomask the lens is moved with respect to the ion flow, and the ion flow is shaped to have an ion beam with a size (D1) in the ion incidence plane which is determined by a radius of curvature (R) of the curved lens surface as $D1 \leq R/6$ or $D1 \leq R/3$.

In at least some embodiments, the first material is silicon and a layer of amorphous silicon containing 5-15 at % of Au is deposited on the surface of the curved layer of silicon prior to ion irradiation and the curved substrate is a lens. During the formation of the curved hard nanomask the lens is moved with respect to the ion flow, and the ion flow is shaped to have an ion beam with a size (D1) in the ion incidence plane which is determined by a radius of curvature (R) of the curved lens surface as D1≤R/2.

In at least some embodiments, the curved substrate is a lens. During the formation of the curved hard nanomask the lens is moved with respect to the ion flow, and the ion flow is shaped to have an ion beam with a size (D2) in the plane perpendicular to the ion incidence plane which is determined by a radius of curvature (R) of the curved lens surface as D2≤R/15.

In at least some other embodiments, the curved substrate is positioned stationary with respect to a specially arranged ion flow.

DETAILED DESCRIPTION

Detailed descriptions of the preferred embodiments are provided herein. It is to be understood, however, that the present inventions may be embodied in various forms. Therefore, specific implementations disclosed herein are not to be interpreted as limiting.

Figure 2A:
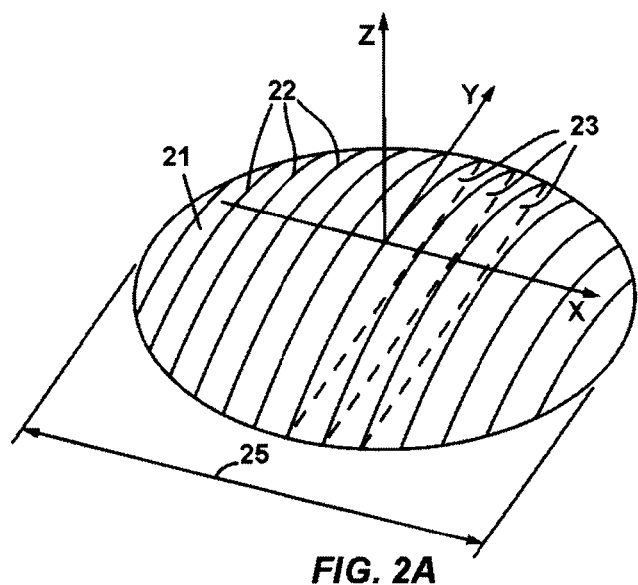
FIG. 2A is a perspective view of the arrangement of a curved hard nanomask on a convex spherical surface, according to the invention.

FIG. 2A is a perspective view of a curved hard nanomask on a convex spherical surface. In at least some embodiments, the polarizer substrate is a transparent, spherical segment 21 having a diameter 25, i.e. the diameter of the segment base. The diameter 25 may be in a range of, for example, 4-200 mm. A thin layer of amorphous silicon (a-Si) is deposited onto the spherical segment 21. The elongated elements of a WOS nanomask are positioned along parallel lines 22 (circle arcs), which are lines of intersections of the curved layer surface with a set of parallel planes 23 that, in the illustrated embodiment, are parallel to the YZ plane of a Cartesian coordinate system XYZ. The origin of the coordinate system is positioned at the top of the spherical segment 21.

Figure 2B:
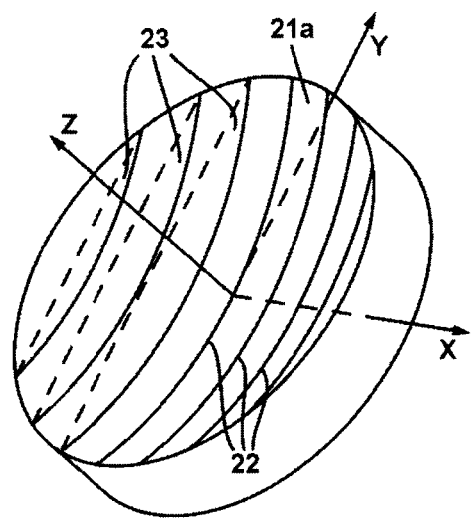
FIG. 2B is a perspective view of the arrangement of a curved hard nanomask on a concave spherical surface, according to the invention.

In at least some other embodiments, the transparent polarizer substrate 21a has a concave spherical surface, as shown in FIG. 2B. On the concave substrate 21a the elements of the WOS nanomask are positioned along parallel lines 22 (circle arcs), which are lines of intersections of the curved a-Si layer surface with a set of parallel planes 23 that, in the illustrated embodiment, are parallel to the YZ plane of a Cartesian coordinate system XYZ. The origin of the coordinate system is positioned at the lowermost point of concave surface of the substrate 21a.

Figure 3:
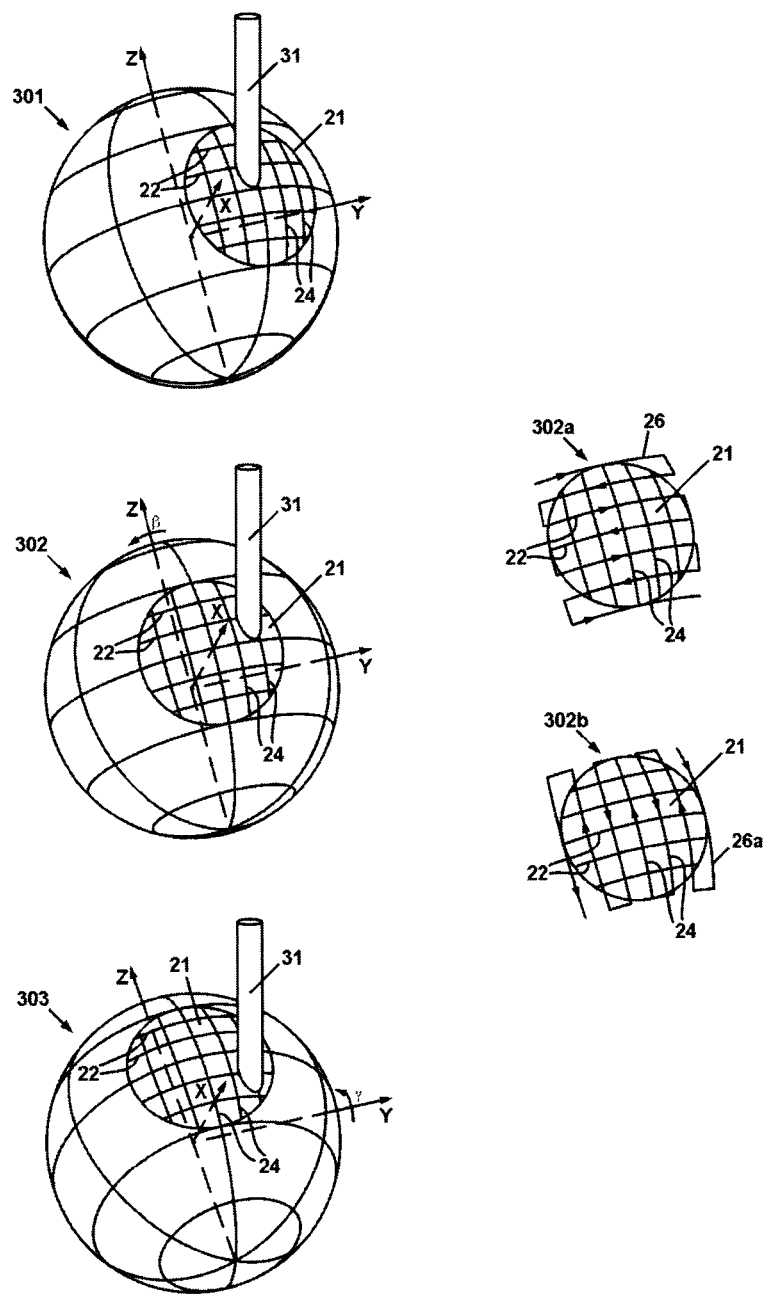
FIG. 3 illustrates perspective views of a fixed ion beam and relative positions of a spherical segment during its movement under the ion beam, according to the invention.

In at least some embodiments, uniform and parallel alignment of the nanomask elements on a spherical surface is achieved through the movement of the substrate under a fixed ion beam as shown in FIG. 3. In 301, the ion beam 31 irradiates the near central area of spherical segment 21. The segment 21 is a part of the sphere. The segment 21 moves under the ion beam along parallel lines 22. In 302, the beam is positioned near the periphery of the segment 21. This segment motion is due to the rotation of the sphere around the Z axis by, for example, an angle β=20°. In at least some embodiments, the segment 21 moves continuously along the lines 22 with a velocity of about 140 μm/s to form one linear stripe of nanomask elements and stops. Then segment 21 makes a step of, for example, about 1 mm for about 0.1 seconds along the line 24 to form the next linear stripe of the nanomask elements along the lines 22 in the opposite direction and so on. This forms a meander scanning pattern 26 which is labeled 302a. The position of the spherical segment 21 in 303 is rotated around Y axis by, for example, an angle γ=20° with respect to the position in 302. In at least some embodiments, the speed of segment movement along lines 22 depends on the ion beam current and the larger the beam current the greater is the speed. For example, the speed of 140 μm/s may correspond to the beam current of about 30 μA and the speed of 4.7 mm/s may correspond to the beam current of about 1 mA. The step movement in the direction along the lines 24 may be, for example, in the range from 0.02 to 0.1 of the ion beam diameter and the smaller the step the faster should be the speed along the lines 22 to keep the ion fluence constant. In some embodiments, the irradiation is implemented using a divergent ion beam with an ion beam incidence angle with respect to the local surface normal of spherical segment that is in the range $\theta=49°-55°$.

In some embodiments with divergent ion beams, another sequence of substrate motion in a meander scanning pattern is implemented. This meander scanning pattern 26a is labeled 302b in FIG. 3. A spherical substrate 21 is moved along lines 24, which are meridians of the globe, and after each line 24 is completed a step along lines 22 is implemented at the periphery of the substrate 21. Ion fluence (dose) is uniformly distributed over the substrate surface at equal local angles of ion incidence. The elements of the WOS nanomask are self-aligned perpendicular to the local ion incidence plane and, in particular for the example illustrated in FIG. 3, the elements of the WOS nanomask are positioned along the lines 22, i.e. along the parallels of the globe.

In at least some embodiments, in the scanning system of FIG. 3, the ion beam may not have a cylindrical shape and may be more extended along meridian lines 24 with a size D1 in the ion incidence plane to cover the range of ion incidence angles from, for example, 44° to 60° and may be narrowed along parallel lines 22 having the size D2 to limit deviation of WOS nanomask elements from the parallel lines 22.

In some embodiments, substrate motion under a fixed ion beam is carried out in a repetitive manner with the ion fluence subdivided between multiple repetitive meander scans 26 or 26a. In this case, the uniformity of ion fluence over the substrate surface may be less dependent on the ion current stability and the greater the number of scans the more uniform is the ion fluence.

In some embodiments, substrate scanning is implemented with a variable, position-dependent speed along lines 22 and 24 of FIG. 3 to compensate for spherical distortions of the rectangular meander patterns 26 and 26a and to obtain uniform ion fluence distribution over the surface of the spherical substrate 21. For example, the lines 22 are arcs with different radii and the radius decreases from the segment center to its periphery. In the meander pattern 26, the arcs are along the lines 22 and constant angular speed for all lines results in smaller fluence at the segment center and larger fluence at peripheral lines 22. To compensate for this fluence nonuniformity the segment 21 can be moved at greater angular speed along peripheral lines 22 in, for example, reverse proportion to the arc radius.

Figure 4:
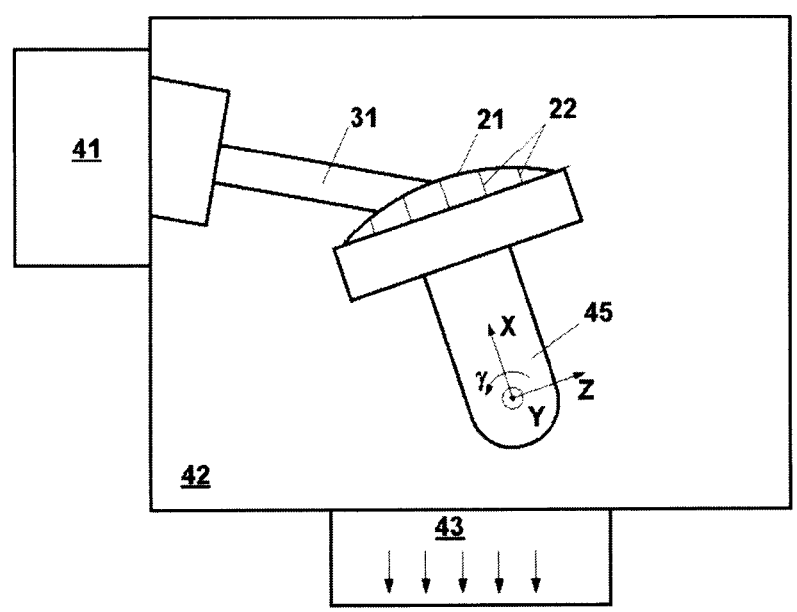
FIG. 4 schematically illustrates an ion beam tool for forming a curved hard nanomask on a moving curved substrate, according to the invention.

The formation of a curved WOS nanomask was implemented in an ion beam system, which is schematically illustrated in FIG. 4. The system includes a vacuum chamber 42, a pump system 43, and a gridded ion source 41, which forms the ion beam 31. A moving mechanism 45 enables rotation of the spherical segment 21 around the Z axis and the Y axis. Elements of a curved WOS nanomask are aligned substantially parallel along the lines 22.

On the spherical surface, the larger the beam size (D2) in the plane perpendicular to the ion incidence plane, the greater is the deviation of the WOS nanomask elements from the lines 22 of FIG. 3 at both of the most distant, opposite beam edges crossing line 22. To decrease such a deviation and to enhance the alignment of the WOS nanomask elements substantially parallel to the lines 22, in some embodiments, during the formation of the curved WOS nanomask, the spherical substrate is moved with respect to an ion beam having a size D2 which is determined by the radius of substrate curvature (R) as $D2 \leq R/15$.

In some embodiments, the spherical segment is a lens having a radius R of the curvature of the external surface. The collimated ion beam, depending on its diameter, has different angles of ion incidence θ across the beam on the curved surface. In some embodiments, the variation of θ in the ion incidence plane may be within the range $\theta=44°-60°$ and the ion beam size D1 in the ion incidence plane is limited to $D1 \leq R/6$. Taking into account the ion dose dependence of the WOS formation process, this ion beam size restriction may be relaxed. In at least some embodiments, the ion beam size D1 is limited by the surface curvature radius R to $D1 \leq R/3$.

In some embodiments, to accelerate the WOS formation process, a gold-containing film is deposited onto the amorphous silicon layer prior to ion irradiation. In some embodiments, the gold-containing film has a thickness in the range of 10 to 25 nm. It has been found that a gold-containing film deposited onto a silicon surface may greatly reduce the time of WOS formation process under nitrogen ion bombardment. $Au^+$ ions implanted into monocrystalline silicon at the energy of 12 keV and fluence $10^{16}$ $cm^{-2}$ accelerated the WOS formation process by about a factor of two for $N_2^+$ ions with E=8 keV and an angle of ion incidence of $\theta=45°$. It is noteworthy that Au implantation did not result in any topographical roughness. Thus, the presence of gold in a surface silicon layer can result in the acceleration of WOS formation. It was also found that the acceleration effect is often angular dependent and may be greater for $N_2^+$ ion incidence angles of $\theta=41°-43°$ whereas almost no acceleration is observed for $\theta=55°-60°$. The nature of angular dependence of WOS formation acceleration may make WOS formation depth almost independent for θ in the range of $\theta=41°-60°$, which means that the ion beam size restriction in scanning system may be further relaxed. In at least some embodiments, on the basis of these observations the ion beam size D1 in the ion incidence plane is related to the substrate surface curvature radius R by $D1 \leq R/2$.

In some embodiments, a composite Si—Au layer, 10-40 nm thick, with Au content ranging from 5-15 at % is deposited on the surface of an amorphous (a-Si) layer prior to $N_2^+$ ion irradiation. The Si—Au layer may be deposited, for example, by magnetron sputtering using a two-component Si/Au target, in which the silicon wafer is used as a mask with through holes leading to a closely attached Au wafer. For this two-component target with masked Au surface the Au content in the deposited Si—Au film is related to the amount of exposed gold area and by sputtering rates of Au and Si in the particular magnetron sputtering system.

In some embodiments, depending on beam focusing, the substrate (lens) diameter 25 shown in FIG. 2A may be in the range 4 to 200 mm.

Figure 5:
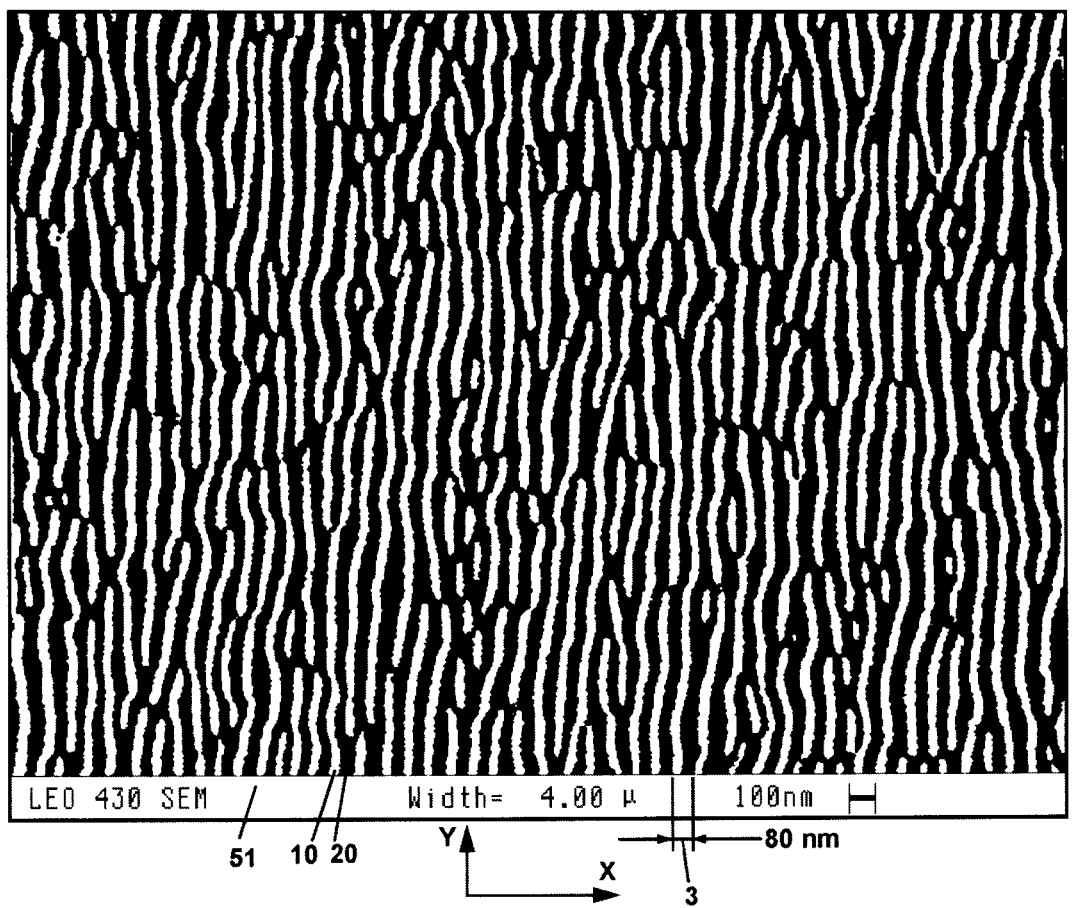
FIG. 5 shows a SEM top view image of a curved WOS hard nanomask having a period of 80 nm and radius of curvature of R=60 mm formed on a moving substrate by two-step irradiation of an amorphous silicon layer with a $N_2^+$ fixed ion beam of about 5 mm in diameter having energy E=3.7 keV at an angle of bombardment $θ_1$=44° from surface normal at the first step and at $θ_2$=60° at the second step, according to the invention.

FIG. 5 shows a SEM top view image of a curved WOS hard nanomask having a period of 80 nm formed by two-step irradiation of an amorphous silicon layer with $N_2^+$ ions having energy E=3.7 keV at an angle of bombardment $\theta_1=44°$ from surface normal at the first step and at $\theta_2=60°$ at the second step. During the irradiation, the curved substrate was moved under a fixed ion beam having a diameter of about 5 mm. The substrate curvature radius was R=60 mm.

Figure 6:
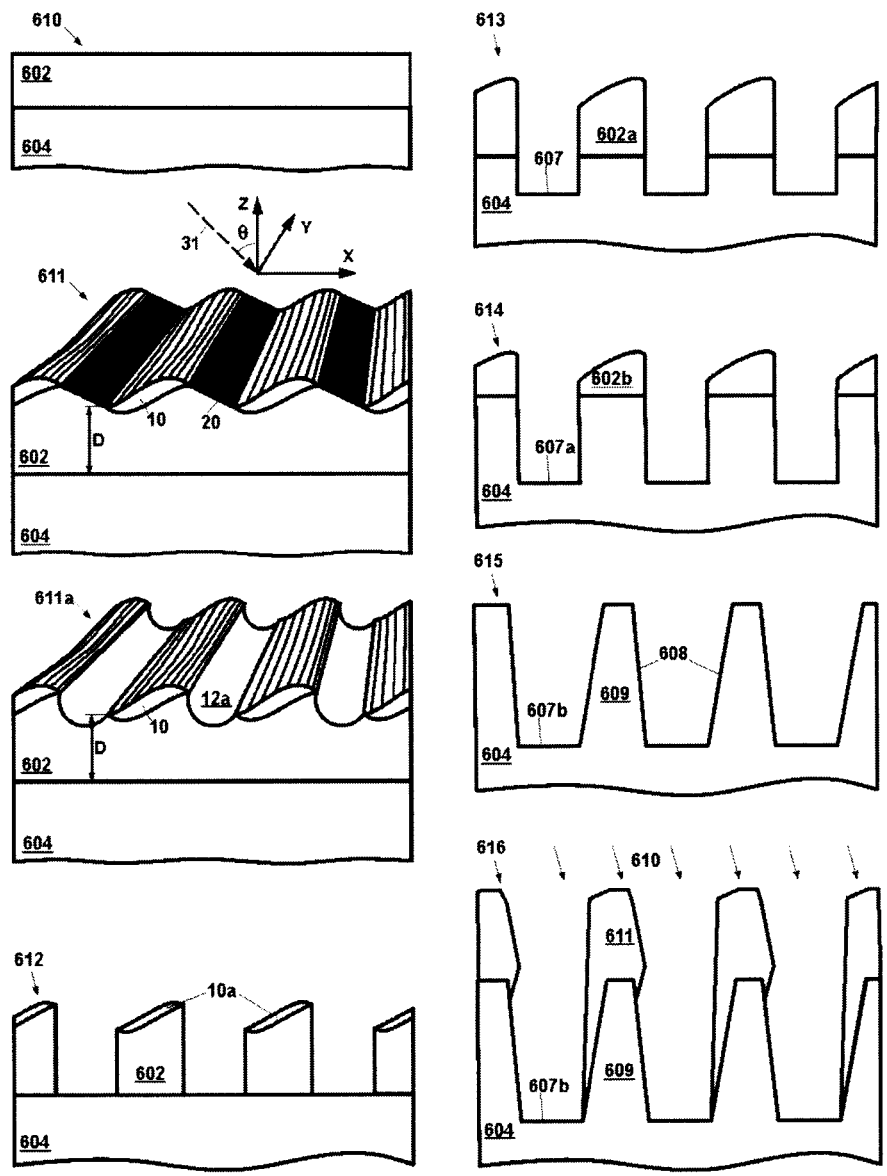
FIG. 6 schematically illustrates steps in one embodiment of a method for formation of a device, such as a wire grid polarizer, using a curved hard nanomask formed in an amorphous silicon layer, according to the invention.

FIG. 6 illustrates one embodiment of a method to manufacture a curved wire grid polarizer or other device on a transparent quartz spherical substrate. It shows a structure 610, including a substrate (e.g., quartz) 604 and a layer of amorphous silicon 602 (for example, approximately 200-400 nm thick).

The amorphous silicon layer 602 may be deposited onto the curved substrate surface, for example, by magnetron sputtering of a silicon target, by silicon target evaporation with an electron beam in high vacuum, or by any other method known in art. The thickness of the layer 602 is selected to enable the formation of a nanostructure with desired period, $\lambda$, (for example, a period of approximately 70-90 nm).

A curved WOS is formed on the surface of substrate 604, which results in the structure 611. In this example, the curved WOS is formed using an oblique ion beam 31 of nitrogen $N_2^+$ ions positioned at the local ion incidence plane XZ (the plane which is defined by a local normal to the surface of the material and a vector oriented in the direction of the ion flow) at angle $\theta$ to the surface normal (Z-axis). In this particular example, to reduce the number of intersections of WOS nanomask elements (waves), the nitrogen ion bombardment is implemented in two steps with different bombardment angles $\theta$. At the first step $\theta=44°$ and at the second step $\theta=60°$. The ion energy for both steps is approximately equal to 3.7 keV. The ion fluence for the first step is approximately ten times greater than that for the second step. The resultant WOS nanomask having a period of 80 nm is shown in FIG. 5. The thick silicon nitride regions 10 and thin silicon nitride regions 20 on the opposite slopes of the waves are mostly elongated in the Y-axis direction. As shown in the structure 611, the wave troughs are spaced from the quartz substrate surface 604 by a distance D, which in a given particular example was of about 60 nm.

Depending on the chosen thickness of the modified layer 20 on the back side of waves of the wavelike nanostructure, a preliminary breakthrough etching step might be performed using argon ion sputtering or sputtering by ions of etching plasma for a relatively short period of time to remove the modified layer 20 from the back side. To remove regions 20 one can also perform wet etching in $HNO_3$—HF solution for a short period of time.

In at least some embodiments, the structure 611 may be optionally wet-etched to form the structure 611a having nanotrenches 12a in place of regions 20. This optional wet etching may improve further etching steps in plasma.

Figure 1A:
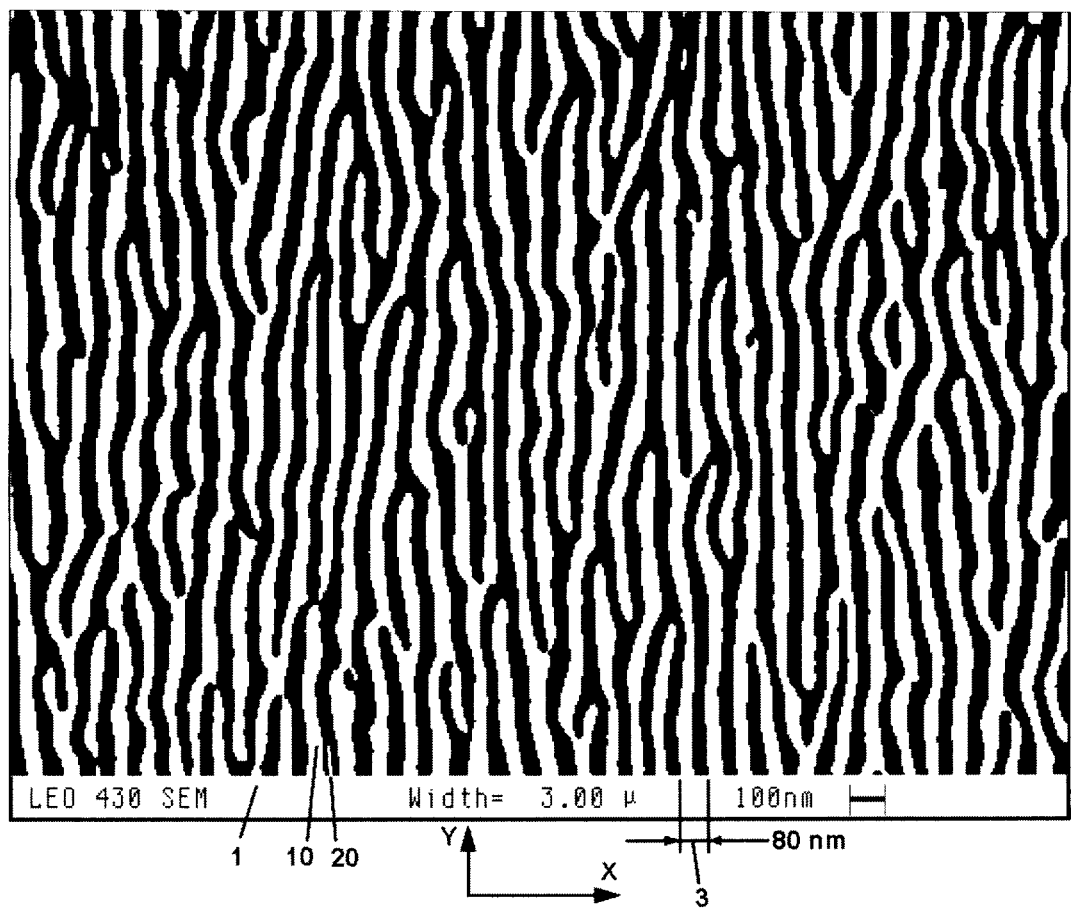
FIG. 1A shows a SEM top view image of a conventional WOS hard nanomask having a period of about 80 nm formed by irradiation of amorphous silicon layer with $N_2^+$ ions having energy E=5 keV at the angle of bombardment θ=53° from surface normal.
Figure 1B:
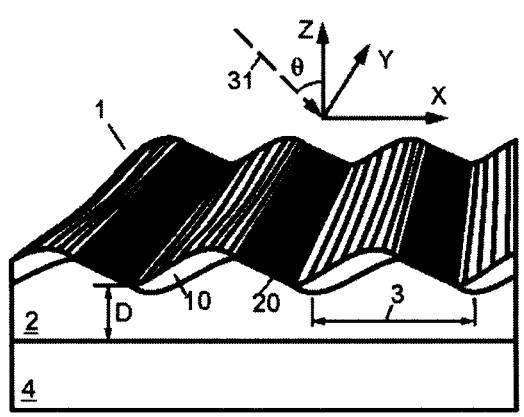
FIG. 1B is a perspective view of elongated ridge elements of a conventional WOS hard nanomask and their wavelike cross-section.
Figure 1C:
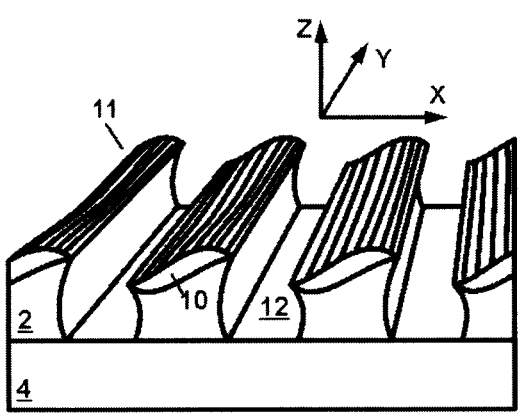
FIG. 1C is a perspective view of elongated ridge elements formed in amorphous silicon layer from a conventional WOS hard nanomask by wet etching.

The curved WOS and nanostructures formed from the curved WOS by etching with the use of regions 10 and 20 as a nanomask can be characterized as a quasi-periodic, anisotropic array of elongated ridge elements having a WOS pattern, each ridge element having a wavelike cross-section and oriented substantially in one direction (Y-axis). An example of the pattern of a WOS is shown in FIG. 1A, and an example of the pattern of a curved WOS is shown in FIG. 5. Ridge elements may be waves or other features having tilted tops or sidewalls. In the wave nanostructure 1 of FIG. 1B, the ridge elements are waves with regions 10 and 20 on opposite wave slopes. In the nanostructure 11 of FIG. 1C, the ridge elements are stripes covered by tilted regions 10 and spaced by trenches 12. One can see that the ridge elements are elongated and mostly oriented in the direction of the Y-axis as shown in FIGS. 1A and 5.

Referring again to FIG. 6, the structures 611 or 611a can be modified by applying a reactive-ion plasma ($Cl_2$, $Cl_2$—Ar, HBr—$O_2$ or $Cl_2$—He—$O_2$ or by any other method known in art) to the amorphous silicon layer 602, using the curved nanomask having regions 10 of silicon nitride. In at least some embodiments, the process results in a modified nanomask having silicon nitride regions 10a formed on top of stripes of amorphous silicon 602, as shown in the structure 612 of FIG. 6. The thickness of regions 10a may become thinner than the thickness of original regions 10 during plasma etching.

Figure 8:
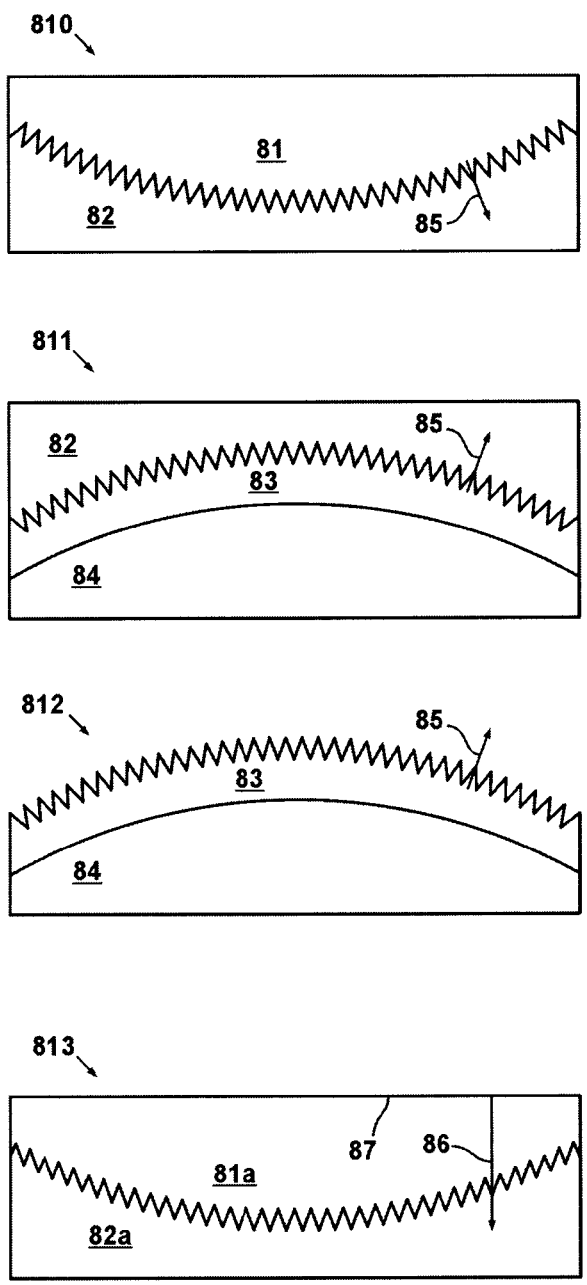
FIG. 8 shows cross-sectional views of polymeric structures with elongated nanoridges formed on curved surfaces formed using nanoimprint lithography, according to the invention.

In the next step, anisotropic etching is applied to the substrate 604. Depending on the type of the substrate material, different types of plasma can be used (for example, for a quartz substrate, $CF_4$—$H_2$, $CHF_3$, $C_4F_6$—Ar or $C_4F_8$—Ar based plasma can be used). The resulting structures 613-615 may include trenches 607, 607a, and 607b. During etching the amorphous silicon stripes 602 may be modified by plasma to the structures 602a and 602b or may be fully etched, which may result in tilted sidewalls 608 of quartz nanoridges 609. In some embodiments, the structure 612 is modified by ion sputtering using a $N_2^+$ ion beam directed along the ridge elements 602 in the YZ ion incidence plane at an angle of, for example, about 53° to the Z axis. The resultant quartz nanoridges have a sawtooth triangular profile with sharp bottoms and tops as shown in FIG. 8.

Oblique deposition of aluminum can be performed on the array of quartz nanoridges as shown in the structure 616 to produce a curved wire-grid polarizer. For uniform deposition, the curved substrate may be moved under the flow of metal atoms 610. In some embodiments, special masks may be applied across the flow of metal atoms to obtain uniform metal nanowires 611. In some embodiments, the mask may include a slit. During the aluminum deposition, the slit mask is positioned along the quartz nanoridges, and the quartz substrate is rotated under the mask in a direction perpendicular to the mask extension for uniform aluminum deposition to the nanoridges.

Figure 7:
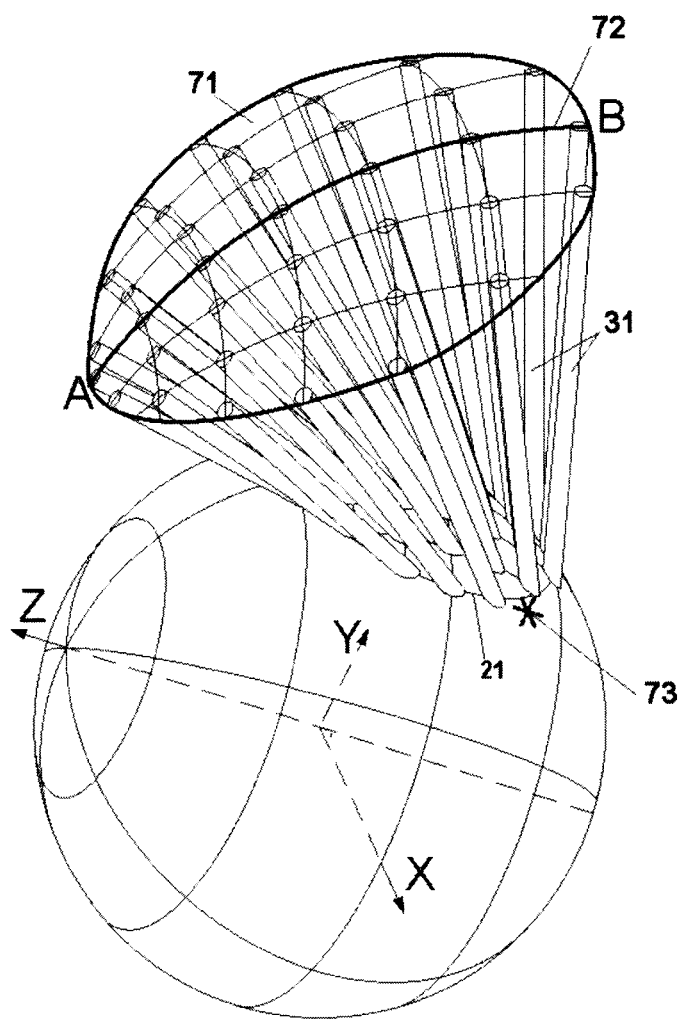
FIG. 7 is a perspective view of a special grid surface of an ion source to manufacture a curved hard nanomask on a fixed curved substrate, according to the invention.

In at least some embodiments, a curved hard WOS nanomask may be manufactured on fixed spherical substrates by a gridded ion source having a special grid surface, which is shown in FIG. 7. The grid 71 provides microbeams 31 that irradiate the surface of the spherical segment 21 with the same local incidence angle (for example, in the range $\theta=49°$-$55°$). The surface of grid 71 may be constructed from an arc circle AB 72 having a center 73 (the quasi focus of the microbeams in ZY plane). The surface of the grid 71 may be produced through the rotation of the arc 72 around the Z axis thus forming the surface of revolution to which each microbeam is normal. The border of the surface of the grid 71 is determined by the microbeams positioned at the border of the spherical segment. In at least some embodiments, the grid 71 may be used to shape the ion flow for manufacturing the curved WOS nanomasks on fixed spherical substrates. In at least some embodiments, the complex grid shape is approximated by a spherical shape.

In at least some embodiments, the spherical surface of a quartz substrate with quartz nanoridges may be used as a master mold to transfer a nanoridge pattern to the surface of a curved polymeric substrate. It will be recognized that materials other than quartz can also be used for the substrate and nanoridges. In at least some embodiments, the spherical surface of a silicon substrate with silicon nanoridges may be used as a master mold to transfer a nanoridge pattern to the surface of a curved polymeric substrate. In some embodiments, the master mold has a convex surface. In some other embodiments, the master mold has a concave surface. In some embodiments, the nanoridge pattern of the silicon master mold is transferred into the surface of a nickel thin layer using, for example, nickel electroless plating onto the silicon mold surface and then a thick nickel layer is electrodeposited to make a nickel mold.

In structure 810 of FIG. 8 the quartz master mold 81 with nanoridges on its surface is used to transfer the nanoridge pattern into the surface of an intermediate hard polymeric mold 82 of, for example, polycarbonate. In structure 811 of FIG. 8, the intermediate hard polymeric mold 82 is applied to the UV curable surface layer 83 on the surface of the polymeric substrate 84 during the process of soft nanoimprint lithography as known in the art. In structure 812 of FIG. 8, the resultant nanoridge pattern is formed on the surface layer 83, which is positioned on the polymeric substrate 84. In structure 812 the sidewalls of each nanoridge may be positioned symmetrically with respect to the local surface normal 85. In structure 813 of FIG. 8, the sidewalls of each nanoridge on the surface of master mold 81a may be positioned symmetrically with respect to the normal 86 to the mold base 87. This symmetrical nanoridge orientation allows the printing of higher nanoridges into the surface of a replica 82a compared to the oblique nanoridges in the structures 810, 811, and 812 of FIG. 8. The oblique deposition of metal onto the polymeric nanoridges results in a curved wire-grid polarizer.

Figure 9A:
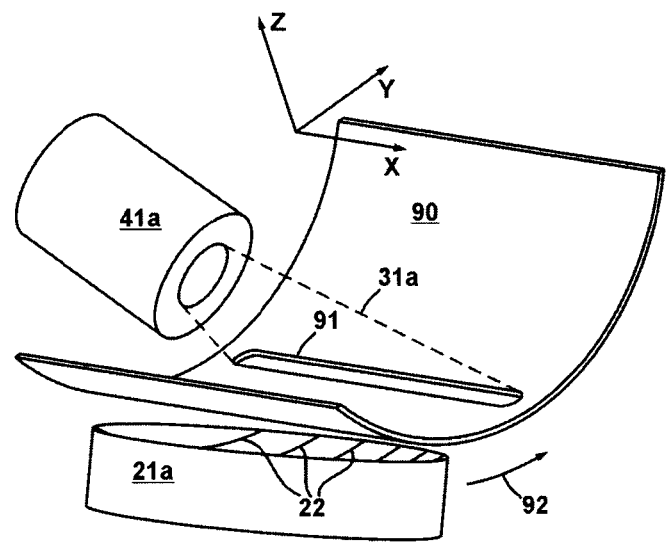
FIG. 9A illustrates a perspective view of a round ion source producing a divergent ion beam, which is shaped by a straight slit in a cylindrical screen, to irradiate a concave spherical substrate during its rotational movement under the slit, according to the invention.

In at least some embodiments, the formation of a WOS nanomask on a concave substrate is carried out by linear ion flow to irradiate a linear stripe area on the substrate surface. FIG. 9A shows one arrangement with a round ion source 41a generating a divergent ion beam 31a, which is directed to a straight slit 91 in a cylindrical screen 90. The ion source 41a may be, for example, a gridded ion source. The divergent ion beam 31a irradiates a concave substrate 21a through the slit 91 thus irradiating a linear stripe area on the substrate surface. To irradiate the surface of the substrate 21a, the substrate is rotationally moved around the X axis under the slit 91 in the direction 92. The slit 91 is extended along the X axis and the ion incidence plane coincides with the XZ plane. The parallel lines 22, along which the elements of WOS nanomask are oriented, are perpendicular to the ion incidence plane during ion bombardment and rotational motion of the substrate 21a under the slit 91. The axis of cylinder screen 90 coincides with the X axis and the center of surface curvature of the substrate 21a is at the origin of the XYZ Cartesian coordinate system. The oblique position of the divergent ion beam 31a with respect to the concave substrate 21a and to the slit 91 provides approximately equal local angles of ion incidence along the irradiated linear stripe area of the substrate surface.

In comparison with the arrangement shown in FIG. 4 where the substrate is rotated around two axes, during ion irradiation in the arrangements shown in FIGS. 9A-9D the substrate is rotated only around the X axis and the substrate motion system is simplified.

Figure 9B:
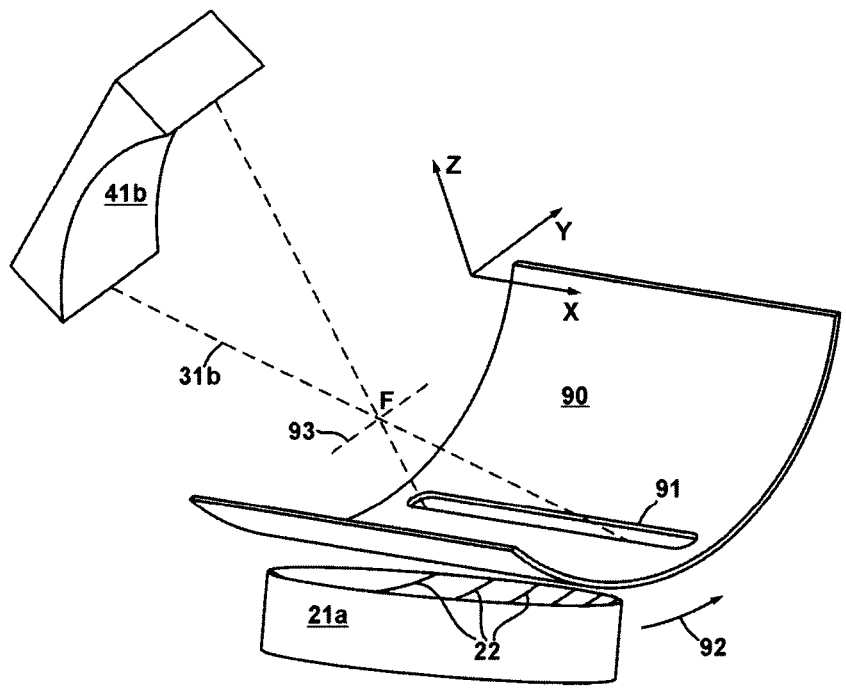
FIG. 9B illustrates a perspective view of a linear cylindrical ion source producing a convergent ion beam, which is shaped by a straight slit in a cylindrical screen, to irradiate a concave spherical substrate during its rotational movement under the slit, according to the invention.

The arrangement shown in FIG. 9B differs from that shown in FIG. 9A in that the ion source 41b is a linear cylindrical ion source generating a convergent ion beam 31b having a crossover at focal line 93, which is parallel to the Y axis. The ion source 41b may be, for example, a gridded ion source with a cylindrical grid.

Figure 9C:
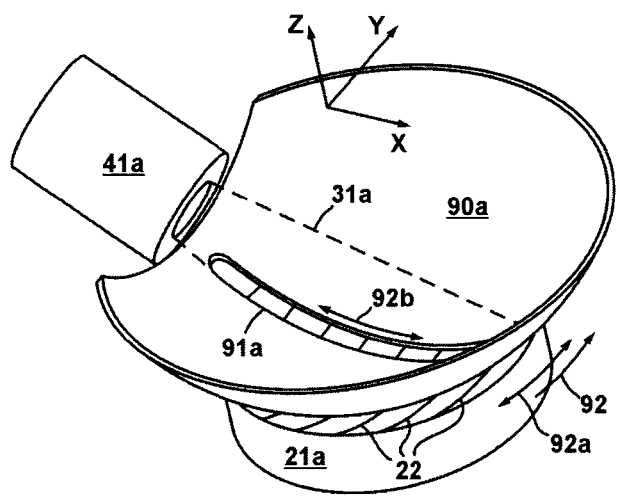
FIG. 9C illustrates a perspective view of a round ion source producing a divergent ion beam, which is shaped by a curved slit in a spherical screen, to irradiate a concave spherical substrate during its rotational movement under the slit, according to the invention.

In the arrangement shown in FIG. 9C a curved slit 91a in a spherical screen 90a is used in place of the straight slit 91 in the cylindrical screen 90 shown in FIGS. 9A and 9B. In FIG. 9C the centers of surface curvature of the spherical screen 90a and the concave substrate 21a coincide and are located at the origin of the XYZ Cartesian coordinate system. The curved slit 91a extends along the ZX plane thus forming the ion flow in the same ion incidence plane. The arrangement shown in FIG. 9C may provide more uniform irradiation of the substrate because the distance between the substrate 21a and the curved slit 91a is constant whereas that distance varies in the case of the straight slit 91 of FIGS. 9A and 9B. However, the straight slit in a cylindrical screen is simpler to manufacture.

Figure 9D:
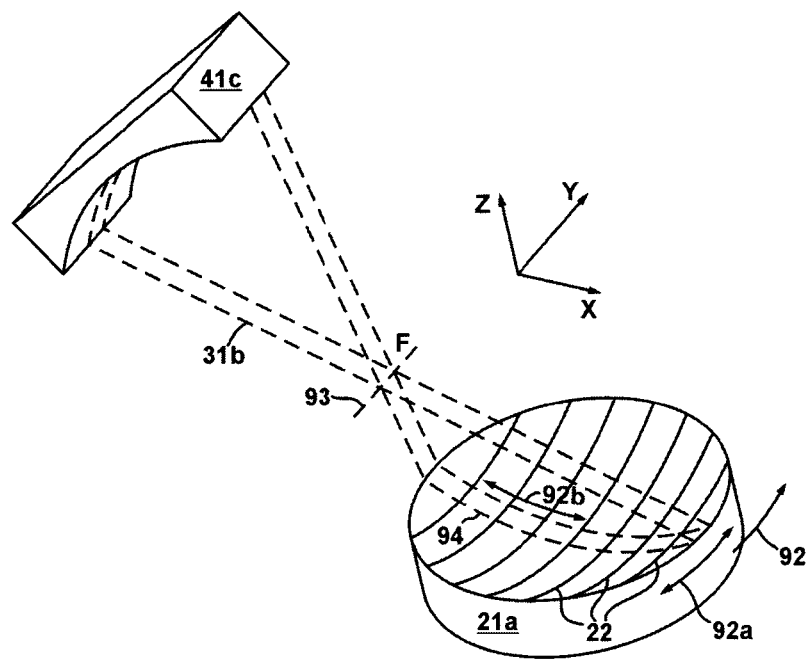
FIG. 9D illustrates a perspective view of a linear cylindrical ion source producing a convergent, flat ion beam which irradiates a linear stripe area across the surface of a concave spherical substrate during its rotational movement, according to the invention.

In the arrangement shown in FIG. 9D the irradiation of the linear stripe area 94 on the surface of the substrate 21a is provided directly by a convergent ion beam 31b generated by a cylindrical ion source 41c. The ion beam 31b has crossover at focal line 93, which is parallel to the Y axis. In at least some embodiments, the uniform fluence on the substrate surface is provided through the appropriate variation of ion beam intensity across the ion source or through slit width variation in the screens 90 and 90a.

In at least some embodiments, in the arrangements shown in FIGS. 9C and 9D, during ion irradiation the substrate 21a is rotationally moved in two directions, first direction 92a around the X axis and second direction 92b around the Y axis, to provide uniform ion fluence on the substrate surface. The substrate motion may be one or multiple meander scans.

The invention can be used, for example, for forming curved nanowire arrays for nanoelectronics and optoelectronics devices.

What is claimed as new and desired to be protected is:

1. A method of forming a curved hard nanomask for transferring a substantially periodic pattern into a curved substrate, the method comprising:
    depositing a first material to form a curved surface layer on top of a surface of the curved substrate; and
    irradiating a surface of the curved surface layer with a flow of ions until a curved hard nanomask is formed, the curved hard nanomask comprising a substantially periodic array of substantially parallel elongated elements having a wave-shaped cross-section, at least some of the elongated elements having the following structure in cross-section: an inner region of first material, a first outer region of a second material covering a first portion of the inner region, and a second outer region of the second material covering a second portion of the inner region and connecting with the first outer region at a wave crest, wherein the first outer region is substantially thicker than the second outer region, and wherein the second material is formed by modifying the first material by the flow of ions, wherein the elongated elements are oriented along lines of intersections of the curved surface layer with a set of parallel planes, and wherein the flow of ions is arranged so as a local plane of ion incidence is substantially perpendicular to the set of parallel planes and oriented along a local surface normal of the curved surface layer.

2. The method of claim 1, wherein a wavelength of the substantially periodic array is in a range from 20 to 150 nm.

3. The method of claim 1, wherein the first material is silicon, amorphous silicon, silicon containing 5-15 at % of gold, silicon oxide, gallium arsenide, epitaxial gallium arsenide, gallium aluminum arsenide, epitaxial gallium aluminum arsenide, germanium, or silicon-germanium.

4. The method of claim 1, wherein the flow of ions comprises a flow of $N_2^+$, $N^+$, $NO^+$, $NH_m^+$, $O_2^+$, $Ar^+$, $Kr+$, $Xe^+$, or a mixture of $Ar^+$ and $N_2^+$ ions.

5. The method of claim 1, wherein a thickness of the first outer region is at least 4 nm.

6. The method of claim 1, wherein a thickness of the second outer region is no more than 2 nm.

7. The method of claim 1, wherein the second material is silicon nitride, silicon nitride containing 5-15 at % of gold, silicon-germanium nitride, silicon oxide, gallium nitride, gallium oxide, aluminum nitride, aluminum oxide, gallium aluminum nitride, or gallium aluminum oxide.

8. The method of claim 1, further comprising, during the irradiating of the surface of the curved surface layer with the flow of ions until the curved hard nanomask is formed, moving the curved substrate with respect to the flow of ions which is shaped to have an ion beam with a size (D1) in the local plane of ion incidence which is determined by a radius (R) of substrate surface curvature as D1≤R/6.

9. A method of forming a curved hard nanomask for transferring a substantially periodic pattern into a curved substrate, the method comprising:
depositing a first material to form a curved surface layer on top of a surface of the curved substrate;
irradiating a surface of the curved surface layer with a flow of ions until a curved hard nanomask is formed, the curved hard nanomask comprising a substantially periodic array of substantially parallel elongated elements having a wave-shaped cross-section, at least some of the elongated elements having the following structure in cross-section: an inner region of first material, a first outer region of a second material covering a first portion of the inner region, and a second outer region of the second material covering a second portion of the inner region and connecting with the first outer region at a wave crest, wherein the first outer region is substantially thicker than the second outer region, and wherein the second material is formed by modifying the first material by the flow of ions, wherein the elongated elements are oriented along lines of intersections of the curved surface layer with a set of parallel planes, and wherein the flow of ions is arranged so as a local plane of ion incidence is substantially perpendicular to the set of parallel planes and oriented along a local surface normal of the curved surface layer, and
during the irradiating of the surface of the curved surface layer with the flow of ions until the curved hard nanomask is formed, moving the curved substrate with respect to the flow of ions which is shaped to have an ion beam with a size (D1) in the local plane of ion incidence which is determined by a radius (R) of substrate surface curvature as D1≤R/3.

10. The method of claim 1, wherein A method of forming a curved hard nanomask for transferring a substantially periodic pattern into a curved substrate, the method comprising:
depositing a first material to form a curved surface layer on top of a surface of the curved substrate,
irradiating a surface of the curved surface layer with a flow of ions until a curved hard nanomask is formed, the curved hard nanomask comprising a substantially periodic array of substantially parallel elongated elements having a wave-shaped cross-section, at least some of the elongated elements having the following structure in cross-section: an inner region of first material, a first outer region of a second material covering a first portion of the inner region, and a second outer region of the second material covering a second portion of the inner region and connecting with the first outer region at a wave crest, wherein the first outer region is substantially thicker than the second outer region, and wherein the second material is formed by modifying the first material by the flow of ions, wherein the elongated elements are oriented along lines of intersections of the curved surface layer with a set of parallel planes, and wherein the flow of ions is arranged so as a local plane of ion incidence is substantially perpendicular to the set of parallel planes and oriented along a local surface normal of the curved surface layer; and
during the irradiating of the surface of the curved surface layer with the flow of ions until the curved hard nanomask is formed, moving the curved substrate with respect to the flow of ions which is shaped to have an ion beam with a size (D2) in a direction perpendicular to the local plane of ion incidence which is determined by radius (R) of curvature of curved lens surface as D2≤R/15.

11. The method of claim 1, wherein, during the irradiating, the curved substrate is positioned stationary with respect to the flow of ions, wherein the flow of ions is shaped by grids.

12. The method of claim 1, wherein the first material is amorphous silicon and wherein the method further comprises, prior to irradiating the surface of the curved surface layer with the flow of ions, depositing a layer of amorphous silicon containing 5-15 at % of gold onto the curved surface layer.

13. The method of claim 12, further comprising, during the irradiating of the surface of the curved surface layer with the flow of ions until the curved hard nanomask is formed, moving the curved substrate with respect to the flow of ions which is shaped to have an ion beam with a size (D1) in the local plane of ion incidence which is determined by a radius (R) of substrate surface curvature as D1≤R/2.

14. The method of claim 9, wherein a wavelength of the substantially periodic array is in a range from 20 to 150 nm.

15. The method of claim 9, wherein the first material is silicon, amorphous silicon, silicon containing 5-15 at % of gold, silicon oxide, gallium arsenide, epitaxial gallium arsenide, gallium aluminum arsenide, epitaxial gallium aluminum arsenide, germanium, or silicon-germanium.

16. The method of claim 9, wherein the flow of ions comprises a flow of $N_2^+$, $N^+$, $NO^+$, $NH_m^+$, $O_2^+$, $Ar^+$, Kr+, $Xe^+$, or a mixture of $Ar^+$ and $N_2^+$ ions.

17. The method of claim 9, wherein a thickness of the first outer region is at least 4 nm.

18. The method of claim 9, wherein a thickness of the second outer region is no more than 2 nm.

19. The method of claim 9, wherein the second material is silicon nitride, silicon nitride containing 5-15 at % of gold, silicon-germanium nitride, silicon oxide, gallium nitride, gallium oxide, aluminum nitride, aluminum oxide, gallium aluminum nitride, or gallium aluminum oxide.

20. The method of claim 9, wherein the first material is amorphous silicon and wherein the method further comprises, prior to irradiating the surface of the curved surface layer with the flow of ions, depositing a layer of amorphous silicon containing 5-15 at % of gold onto the curved surface layer.

21. The method of claim 10, wherein a wavelength of the substantially periodic array is in a range from 20 to 150 nm.

22. The method of claim 10, wherein the first material is silicon, amorphous silicon, silicon containing 5-15 at % of gold, silicon oxide, gallium arsenide, epitaxial gallium arsenide, gallium aluminum arsenide, epitaxial gallium aluminum arsenide, germanium, or silicon-germanium.

23. The method of claim 10, wherein the flow of ions comprises a flow of $N_2^+$, $N^+$, $NO^+$, $NH_m^+$, $O_2^+$, $Ar^+$, Kr+, $Xe^+$, or a mixture of $Ar^+$ and $N_2^+$ ions.

24. The method of claim 10, wherein a thickness of the first outer region is at least 4 nm.

25. The method of claim 10, wherein a thickness of the second outer region is no more than 2 nm.

26. The method of claim 10, wherein the second material is silicon nitride, silicon nitride containing 5-15 at % of gold, silicon-germanium nitride, silicon oxide, gallium nitride, gallium oxide, aluminum nitride, aluminum oxide, gallium aluminum nitride, or gallium aluminum oxide.

27. The method of claim 10, wherein the first material is amorphous silicon and wherein the method further comprises, prior to irradiating the surface of the curved surface layer with the flow of ions, depositing a layer of amorphous silicon containing 5-15 at % of gold onto the curved surface layer.

\* \* \* \* \*